(12) United States Patent
Liao et al.

(10) Patent No.: US 9,306,134 B2
(45) Date of Patent: Apr. 5, 2016

(54) ENCAPSULATING COMPOSITION AND LIGHT EMITTING DEVICE

(71) Applicant: DAXIN MATERIALS CORP., Taichung (TW)

(72) Inventors: Yuan-Li Liao, Taichung (TW); Chang-Hung Lee, Taichung (TW)

(73) Assignee: DAXIN MATERIALS CORP., Taichung (TW)

( * ) Notice: Subject to any disclaimer, the term of this patent is extended or adjusted under 35 U.S.C. 154(b) by 0 days.

(21) Appl. No.: 14/278,584

(22) Filed: May 15, 2014

(65) Prior Publication Data

US 2014/0339585 A1    Nov. 20, 2014

(30) Foreign Application Priority Data

May 17, 2013    (TW) .............................. 102117568 A

(51) Int. Cl.
| | | |
|---|---|---|
| *H01L 33/00* | (2010.01) | |
| *H01L 33/56* | (2010.01) | |
| *C09K 11/02* | (2006.01) | |
| *H01L 33/50* | (2010.01) | |

(52) U.S. Cl.
CPC ................ *H01L 33/56* (2013.01); *C09K 11/02* (2013.01); *H01L 33/502* (2013.01)

(58) Field of Classification Search
CPC ....... H01L 33/50; H01L 33/502; H01L 33/56; H01L 33/58; C09K 11/02; C09K 11/77
USPC ............................ 257/98, 787, 788, 789, 795
See application file for complete search history.

(56) References Cited

U.S. PATENT DOCUMENTS

| | | | |
|---|---|---|---|
| 8,723,167 B2 | 5/2014 | Sato et al. | |
| 2012/0256222 A1 | 10/2012 | Sasaki et al. | |
| 2013/0241390 A1* | 9/2013 | Guschl | 313/498 |
| 2014/0008697 A1* | 1/2014 | Harkness et al. | 257/100 |
| 2014/0284649 A1* | 9/2014 | Baumgartner et al. | 257/98 |
| 2015/0048406 A1 | 2/2015 | Sasaki et al. | |

FOREIGN PATENT DOCUMENTS

| | | |
|---|---|---|
| JP | 2009-239242 | 10/2009 |
| TW | 201249898 | 12/2012 |
| TW | 201309767 | 3/2013 |
| TW | 201310726 | 3/2013 |
| WO | 2011/077637 | 6/2011 |

OTHER PUBLICATIONS

TW Search Report, dated Jul. 28, 2015; Application No. 102117568.

* cited by examiner

*Primary Examiner* — Colleen A Matthews
*Assistant Examiner* — Colleen E Snow
(74) *Attorney, Agent, or Firm* — Young & Thompson

(57) ABSTRACT

An encapsulating composition for a light emitting device includes a transparent resin, a plurality of light scattering particles distributed throughout the transparent resin and having an average particle size ranging from 190 nm to 450 nm, and a plurality of phosphor particles distributed throughout the transparent resin. A light emitting device includes the encapsulating composition and a light emitting diode that is encapsulated by the encapsulating composition.

15 Claims, No Drawings

ENCAPSULATING COMPOSITION AND LIGHT EMITTING DEVICE

CROSS-REFERENCE TO RELATED APPLICATION

This application claims priority of Taiwanese Patent Application No. 102117568, filed on May 17, 2013, the entire disclosure of which is hereby incorporated by reference.

BACKGROUND OF THE INVENTION

1. Field of the Invention

This invention relates to an encapsulating composition and a light emitting device, more particularly to an encapsulating composition used in a light emitting device.

2. Description of the Related Art

Nowadays, light emitting diode (LED) technology focuses on improving illuminating efficiency, brightness, service life and reducing manufacturing cost. The illuminating efficiency of a LED light emitting device is mainly affected by a LED chip and an encapsulating composition used for encapsulating the LED chip. The conventional LED chip is made of gallium nitride (GaN, having a refractive index of 2.5) or gallium phosphide (GaP, having a refractive index of 3.45). The conventional encapsulating composition includes transparent resin (e.g., epoxy resin, silicone resin or urea resin) and has a refractive index ranging between 1.4 and 1.53. The difference between the refractive indices of the LED chip and the encapsulating composition results in only 30% of light extraction efficiency of the LED light emitting device although the LED chip may have 90% of light extraction efficiency. In order to enhance the refractive index of the encapsulating composition, organic and/or inorganic material is/are commonly added into the encapsulating composition.

Another conventional encapsulating composition is used in a white light emitting device and includes a transparent resin and a photoluminescent material (for example, phosphor particles). The photoluminescent material absorbs a portion of light emitted by the LED chip of the light emitting device and re-emits light with a different wavelength. The light emitted by the LED chip is mixed with the light re-emitted by the phosphor particles to obtain white light. However, the phosphor particles are relatively expensive since they are obtained from rare metal.

In yet another conventional encapsulating composition, in addition to the phosphor particles, light scattering particles are added into the transparent resin so as to increase collisions between light and the phosphor particles. The amount of the phosphor particles can thus be decreased. However, it is found that the brightness of the light emitting device would be decreased when the phosphor particles are partly replaced by the light scattering particles.

SUMMARY OF THE INVENTION

Therefore, the object of the present invention is to provide an encapsulating composition and a light emitting device that can overcome the aforesaid drawbacks of the prior art.

According to one aspect of the present invention, there is provided an encapsulating composition for a light emitting device. The encapsulating composition includes a transparent resin, a plurality of light scattering particles distributed throughout the transparent resin and having an average particle size ranging from 190 nm to 450 nm, and a plurality of phosphor particles distributed throughout the transparent resin.

According to another aspect of the present invention, there is provided a light emitting device that includes the aforesaid encapsulating composition, and a light emitting diode encapsulated by the aforesaid encapsulating composition.

DETAILED DESCRIPTION OF THE PREFERRED EMBODIMENTS

The preferred embodiment of an encapsulating composition for a light emitting device according to the present invention includes a transparent resin, a plurality of light scattering particles distributed throughout the transparent resin and having an average particle size ranging from 190 nm to 450 nm, and a plurality of phosphor particles distributed throughout the transparent resin.

Preferably, the transparent resin is a thermosetting resin. Examples of the thermosetting resin include acrylic resin, polycarbonate resin, epoxy resin, and polysiloxane resin. More preferably, the thermosetting resin is polysiloxane resin.

The phosphor particles are made of a photoluminescent material containing organic and/or inorganic phosphor material. The phosphor particles are made from orthosilicate-based phosphor, nitride-based phosphor, sulfate-based phosphor, oxynitride-based phosphor, oxysulfate-based phosphor, and yttrium aluminum garnet (YAG) phosphor (e.g., $Y_3Al_5O_{12}$:Ce).

Preferably, the phosphor particles have an average particle size ranging from 5 μm to 20 μm.

Preferably, the phosphor particles are in an amount ranging from 5 to 30 parts by weight based on 100 parts by weight of the transparent resin. More preferably, the phosphor particles are in an amount ranging from 5.2 to 7 parts by weight based on 100 parts by weight of the transparent resin.

The light scattering particles are made of light scattering materials that can scatter light by reflection, refraction and/or diffraction. For example, the light scattering particles are made of titanium dioxide, silicon dioxide, boron nitride, aluminium oxide, barium sulfate, calcium carbonate, zirconia, zinc oxide, magnesium oxide, iron oxide, and combinations thereof. Preferably, the light scattering particles are made of titanium dioxide.

Preferably, the light scattering particles have an average particle size ranging from 210 nm to 350 nm.

Preferably, the light scattering particles are in an amount ranging from 0.001 to 0.2, more preferably from 0.001 to 0.15, even more preferably from 0.05 to 0.15, and most preferably from 0.063 to 0.1, part by weight based on 100 parts by weight of the transparent resin.

Preferably, the ratio in parts by weight of the light scattering particles to the phosphor particles is from 1:40 to 1:112. More preferably, the ratio in parts by weight of the light scattering particles to the phosphor particles is from 1:62 to 1:112. Even more preferably, the ratio in parts by weight of the light scattering particles to the phosphor particles is from 1:100 to 1:112.

The preferred embodiment of a light emitting device according to the present invention includes the aforesaid encapsulating composition and a light emitting diode (LED) encapsulated by the aforesaid encapsulating composition.

A packaging method used for the light emitting device is not limited and may vary based on actual requirements. Preferably, a reflector cup is used for packaging the LED.

In an example, a light emitting diode that can generate blue light having an average wavelength ranging between 440 and 480 nm is used, and YAG phosphor is used as the phosphor particles. By mixing the blue light with the light re-emitted by the phosphor particles, the light emitting device can generate white light.

This invention will be further described by way of the following examples. However, it should be understood that the following examples are solely for the purpose of illustration and should not be construed as limiting the invention in practice.

EXAMPLES

Source of Chemicals

1. LEH016: a transparent resin, commercially available from Daxin Materials Corporation.
2. TTO-55S ($TiO_2$): light scattering particles, commercially available from ISK TAIWAN CO., LTD.
3. LYAG540: phosphor particles made of YAG, commercially available from ITA Certech Registration (Taiwan) INC.

Example 1 (E1)

6.3 parts by weight of LYAG540, 0.063 part by weight of TTO-55S having an average particle size of 220 nm, and 100 parts by weight of LEH016 were uniformly mixed using a planetary mixer at 1500 rpm for 5 minutes so as to form an encapsulating composition of Example 1.

Examples 2 to 7 (E2 to E7)

Preparation of encapsulating compositions of each of Examples 2 to 7 was similar to that of Example 1, except for the amounts and the particle sizes of TTO-55S and the amounts of LYAG540. The detailed information for the encapsulating compositions of Examples 2 to 7 are listed in Table 1.

Comparative Examples 1 to 4 (CE1 to CE4)

Preparation of encapsulating compositions of each of Comparative Examples 1 to 4 was similar to that of Example 1, except for the amounts and the particle sizes of TTO-55S and the amounts of LYAG540. The detailed information for the encapsulating compositions of Comparative Examples 1 to 4 are listed in Table 1.

Test

Each of the encapsulating compositions of E1 to E7 and CE1 to CE4 was used to encapsulate a light emitting diode (LED) that emits blue light (wavelength ranging between 440 and 480 nm) so as to obtain a light emitting device.

To be specific, each of the encapsulating compositions of E1 to E7 and CE1 to CE4 was uniformly mixed using a planetary mixer, was defoamed, and was injected into a reflector cup (in which the blue light LED is disposed) using a dispenser so as to encapsulate the LED. The reflector cup along with the LED and the encapsulating composition inside the reflector cup was then disposed in an oven to thermoset the encapsulating composition under 150° C. for 2.5 hours, followed by cooling so as to obtain the light emitting device.

The brightness and the chromaticity coordinate of the light emitting device of each Example and Comparative Example were measured using integrating spheres. Relative brightness based on the brightness of Example 1 was then calculated.

For example, relative brightness for the light emitting diode of Example 2 was calculated using the following formula:

$$\text{Relative brightness of } Ex.2 = \frac{\text{brightness of } Ex.\ 2 - \text{brightness of } Ex.\ 1}{\text{brightness of } Ex.\ 1} \times 100\%$$

TABLE 1

| | Transparent resin (LEH016) | Light scattering particles (TTO-55S) | | Phosphor particles (LYAG540) | Relative |
|---|---|---|---|---|---|
| | Amount (Parts by weight) | Amount (Parts by weight) | Particle size (nm) | Amount (Parts by weight) | brightness (%) |
| Exp. | | | | | |
| E1 | 100 | 0.063 | 220 | 6.3 | 0 |
| E2 | 100 | 0.1 | 220 | 6.2 | −0.7 |
| E3 | 100 | 0.15 | 220 | 6 | −1 |
| E4 | 100 | 0.063 | 195 | 7 | −0.7 |
| E5 | 100 | 0.063 | 220 | 7 | 0 |
| E6 | 100 | 0.063 | 350 | 7 | 0.1 |
| E7 | 100 | 0.063 | 450 | 7 | −0.6 |
| Comparative example | | | | | |
| CE1 | 100 | none | none | 7 | 0 |
| CE2 | 100 | 0.063 | 650 | 7 | −2.0 |
| CE3 | 100 | 0.063 | 980 | 7 | −2.2 |
| CE4 | 100 | 0.063 | 1200 | 7 | −6 |

Results

Referring to Table 1, it is shown that the light emitting device of each of E1 to E7 (especially E5 and E6) exhibits superior brightness to that of CE2 to CE4. The results indicate that the brightness could be greatly improved by controlling the average particle size of the light scattering particles to be within 190 to 450 nm even though the amount of the phosphor particles is reduced from 7 parts by weight to 6.3 parts by weight (see E1). Moreover, comparing E1 and CE1, although the amount of the phosphor particles is reduced from 7 parts by weight to 6.3 parts by weight, the brightness could be maintained by addition of the light scattering particles with a particular average particle size.

While the present invention has been described in connection with what are considered the most practical and preferred embodiments, it is understood that this invention is not limited to the disclosed embodiments but is intended to cover various arrangements included within the spirit and scope of the broadest interpretation and equivalent arrangements.

What is claimed is:

1. An encapsulating composition for a light emitting device, comprising:
   a transparent resin;
   a plurality of light scattering particles distributed throughout said transparent resin and having an average particle size ranging from 190 nm to 450 nm; and
   a plurality of phosphor particles distributed throughout said transparent resin,
   wherein said light scattering particles are in an amount ranging from 0.063 to 0.15 part by weight based on 100 parts by weight of said transparent resin.

2. The encapsulating composition as claimed in claim 1, wherein said light scattering particles have an average particle size ranging from 210 nm to 350 nm.

3. The encapsulating composition as claimed in claim 1, wherein said light scattering particles are made of a material selected from the group consisting of titanium dioxide, silicon dioxide, boron nitride, aluminum oxide, barium sulfate, calcium carbonate, zirconia, zinc oxide, magnesium oxide, iron oxide, and combinations thereof.

4. The encapsulating composition as claimed in claim 1, wherein said light scattering particles are made of titanium dioxide.

5. The encapsulating composition as claimed in claim 1, wherein said light scattering particles are in an amount ranging from 0.063 to 0.1 part by weight based on 100 parts by weight of said transparent resin.

6. The encapsulating composition as claimed in claim 1, wherein said phosphor particles have an average particle size ranging from 5 µm to 20 µm.

7. The encapsulating composition as claimed in claim 1, wherein said phosphor particles are in an amount ranging from 5 to 30 parts by weight based on 100 parts by weight of said transparent resin.

8. The encapsulating composition as claimed in claim 7, wherein said phosphor particles are in an amount ranging from 6 to 7 parts by weight based on 100 parts by weight of said transparent resin.

9. The encapsulating composition as claimed in claim 1, wherein said transparent resin is a thermosetting resin.

10. The encapsulating composition as claimed in claim 9, wherein said thermosetting resin is selected from the group consisting of acrylic resin, polycarbonate resin, epoxy resin, polysiloxane resin, and combinations thereof.

11. The encapsulating composition as claimed in claim 10, wherein said thermosetting resin is polysiloxane resin.

12. The encapsulating composition as claimed in claim 1, wherein the ratio in parts by weight of said light scattering particles to said phosphor particles is from 1:40 to 1:112.

13. The encapsulating composition as claimed in claim 12, wherein the ratio in parts by weight of said light scattering particles to said phosphor particles is from 1:62 to 1:112.

14. The encapsulating composition as claimed in claim 13, wherein the ratio in parts by weight of said light scattering particles to said phosphor particles is from 1:100 to 1:112.

15. A light emitting device comprising:
an encapsulating composition as claimed in claim 1; and
a light emitting diode encapsulated by said encapsulating composition.

* * * * *